(12) United States Patent
Gueckel et al.

(10) Patent No.: US 9,935,397 B2
(45) Date of Patent: Apr. 3, 2018

(54) ELECTRICAL DEVICE AND CONNECTION ARRANGEMENT INCLUDING AN ELECTRICAL DEVICE

(71) Applicant: Robert Bosch Gmbh, Stuttgart (DE)

(72) Inventors: Richard Gueckel, Schwieberdingen (DE); Markus Kroeckel, Schwieberdingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/117,087

(22) PCT Filed: Dec. 8, 2014

(86) PCT No.: PCT/EP2014/076808
§ 371 (c)(1),
(2) Date: Aug. 5, 2016

(87) PCT Pub. No.: WO2015/117695
PCT Pub. Date: Aug. 13, 2015

(65) Prior Publication Data
US 2017/0085030 A1    Mar. 23, 2017

(30) Foreign Application Priority Data

Feb. 7, 2014    (DE) ........................ 10 2014 202 296

(51) Int. Cl.
*H01R 13/631* (2006.01)
*H05K 5/00* (2006.01)
(Continued)

(52) U.S. Cl.
CPC ....... *H01R 13/631* (2013.01); *B60R 16/0215* (2013.01); *H05K 5/0069* (2013.01); *H01R 13/62938* (2013.01); *H01R 2201/26* (2013.01)

(58) Field of Classification Search
CPC ................................................ H01R 13/62938
(Continued)

(56) References Cited

U.S. PATENT DOCUMENTS 7,094,075 B1    8/2006  Hua et al.
7,637,757 B2 *  12/2009 Matsumura ...... H01R 13/62938
                                                   439/157
(Continued)

FOREIGN PATENT DOCUMENTS

DE    3310477 A1    1/1984
DE    102004060302 A1    7/2005
FR    2979518 A1    3/2013

OTHER PUBLICATIONS

International Search Report dated Mar. 4, 2015, of the corresponding International Application PCT/EP2014/076808 filed Dec. 8, 2014, 2 pages.

*Primary Examiner* — Tho D Ta
*Assistant Examiner* — Marcus Harcum
(74) *Attorney, Agent, or Firm* — Norton Rose Fulbright US LLP; Gerard Messina

(57) ABSTRACT

An electrical device, in particular a switching unit or control unit for a motor vehicle, including a housing, which includes a connection area for electrically contacting the housing with a connecting plug, the connection area including at least one receiving contour, which has a circumferential wall area, for the connecting plug, the wall area encompassing electrical connecting elements, and at least one fixing or locking element being provided in the connection area, which is designed to connect the connecting plug to the housing in the connection area. It is provided that at least one fixing or locking element is situated in each case both inside and outside the wall area.

12 Claims, 3 Drawing Sheets

(51) Int. Cl.
*B60R 16/02* (2006.01)
*H01R 13/629* (2006.01)

(58) Field of Classification Search
USPC .................................................. 439/157, 352
See application file for complete search history.

(56) References Cited

U.S. PATENT DOCUMENTS

| | | | | |
|---|---|---|---|---|
| 9,028,265 | B2* | 5/2015 | Aoki | H01R 13/62933 439/157 |
| 2004/0023535 | A1* | 2/2004 | Gundermann | H01R 13/62944 439/157 |
| 2004/0095732 | A1 | 5/2004 | Azumi et al. | |
| 2005/0064749 | A1* | 3/2005 | Stella | H01R 13/453 439/157 |
| 2005/0142912 | A1* | 6/2005 | Shigeta | H01R 13/62933 439/157 |
| 2008/0096408 | A1* | 4/2008 | Tajiri | H01R 13/62955 439/157 |
| 2009/0047812 | A1* | 2/2009 | Deno | H01R 13/748 439/157 |
| 2009/0246991 | A1* | 10/2009 | Shuey | H01R 13/62955 439/157 |
| 2010/0130039 | A1* | 5/2010 | Chen | H01R 13/639 439/157 |
| 2012/0329302 | A1* | 12/2012 | Genta | H01R 13/62977 439/157 |

* cited by examiner

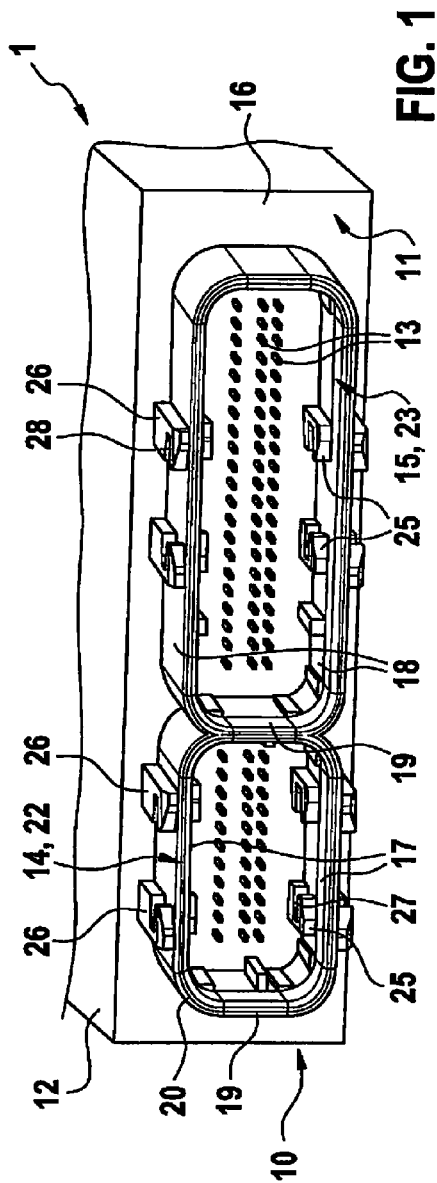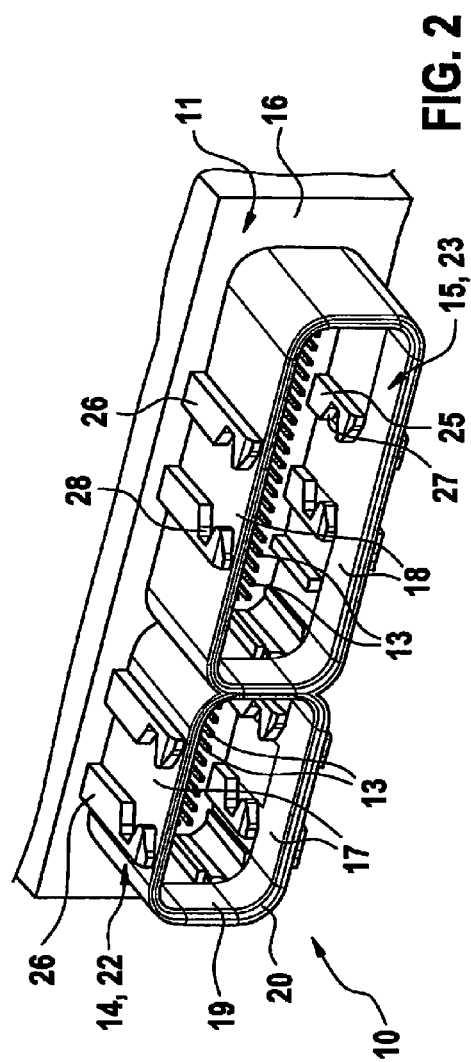

ELECTRICAL DEVICE AND CONNECTION ARRANGEMENT INCLUDING AN ELECTRICAL DEVICE

FIELD

The present invention relates to an electrical device, in particular a switching unit or control unit for a motor vehicle. Furthermore, the present invention relates to a connection arrangement between an electrical device according to the present invention and a connecting plug.

BACKGROUND INFORMATION

An electrical device for a switching or control unit is described in German Patent No. DE 33 10 477 A1. This electrical device is used inside a motor vehicle, for example, as a control unit for an injection system and has a housing for accommodating a circuit carrier in the form of a circuit board. The electrical contacting of the electrical device takes place via a connection area of the housing, which is situated on a front side of the housing. For this purpose, a front side of the housing is closed with the aid of a plug body, which is typically designed as a plastic injection-molded part. Connecting pins and/or connecting lugs protrude through the plug body, which may be electrically contacted on the one hand with the circuit carrier inside the housing and on the other hand with a vehicle-side wiring harness plug, referred to hereafter as a connecting plug. The plug pins are situated inside a typically rectangular, circumferential, and closed wall area of the plug body (plug collar). To contact the electrical device with the connecting plug, the connecting plug encompasses the wall area (plug collar) of the plug body on its outer circumference, centering of the connecting plug on the circumferential wall area of the plug body taking place due to corresponding geometric dimensioning of the connecting plug, so that the electrical contacting of the connecting pins with corresponding counter elements in the connecting plug takes place without problems. To additionally connect or lock the connecting plug to the electrical device in a mechanically fixed way, the known electrical device has multiple latches in the area of its plug body outside the wall area, which interact with a corresponding counter contour on the connecting plug. Furthermore, the connecting plug has a closure lever, for example, which interacts with the latches and, in its locking position, produces a clamped or force-fit connection of the connecting plug to the electrical device.

A connection arrangement between an electrical device and a (vehicle-side) connection and/or wiring harness plug, in which a fixing or locking element (latch on the plug body) situated outside the circumferential wall area of the receiving contour on the electrical device and used with the connecting plug, is also referred to as an outer lock. An outer lock enables in particular relatively good leak-tightness between the receiving contour and the connecting plug, which makes the penetration of moisture, etc., more difficult or prevents it, since the connecting plug encompasses the receiving contour and/or the wall area from the outside. It is disadvantageous that the connection arrangement inevitably has a relatively large width due to the connecting plug situated outside the circumferential wall area and the closure mechanism thereof. This is problematic in particular in the case of cramped installation conditions in motor vehicles, in which, for example, the height of the electrical device has to be selected to be as small as possible. For this reason, connection arrangements between an electrical device and a connecting plug are also known from the related art, in which the fixing or locking elements are situated inside the receiving contour and/or the circumferential wall area of the connecting plug. The (vehicle-side) connecting plug is situated in this case inside the receiving contour of the plug body, so that particularly low electrical devices may be produced with regard to a housing height of the electrical device (and/or the width of the receiving contour). It may be disadvantageous that such an arrangement of the fixing or locking elements and the connecting plug, which form a so-called inner lock, do not achieve the leak-tightness of an outer lock with respect to the leak-tightness. However, there are applications in which an inner lock is used either due to cramped installation conditions, or due to leak-tightness requirements not being required. In summary, conventional connection arrangements are designed either to form an outer lock or an inner lock, whereby the fixing or locking elements are situated for this purpose either outside the receiving contour or inside the receiving contour of the connection area on the electrical device.

SUMMARY

The present invention may refine an electrical device, in particular a switching unit or control unit in a motor vehicle in such a way that it is universally usable for using or forming both an outer lock and an inner lock. In other words, this means that the same connection area of the housing of the electrical device is to be usable with different (vehicle-side) connecting plugs.

In accordance with the present invention, an electrical device has in each case at least one fixing or locking element is situated both inside and outside the wall area of the connection area of the electrical device. In other words, this means that in the case of a vehicle-side connecting plug which is designed to form an outer lock, the at least one fixing or locking element which is situated outside the wall area interacts with the connecting plug, while in the case of use with a connecting plug which is designed to form an inner lock, the at least one fixing or locking element situated inside the wall area interacts with the connecting plug.

In one particularly preferred embodiment, it is provided that the at least one fixing or locking element is fastened directly on the wall area. A particularly small width of the connection area is thus achieved in particular, since, in contrast to the related art mentioned at the outset, the at least one fixing or locking element is not situated spaced apart from the wall area. In addition, a particularly good seal may also thus be achieved between the wall area and the connecting plug, since the produced clamping or holding forces between the electrical device and the connecting plug are produced in direct proximity to the wall area.

In one preferred refinement of the last-mentioned suggestions, it is provided that the at least one fixing or locking element is molded in one piece on the wall area. In other words, this means that the housing of the electrical device is designed in particular as an injection-molded part in the area of the connection area, in which the at least one fixing or locking element may also be taken into consideration at the same time during the manufacturing of the connection area, so that the manufacturing cost is particularly low, in contrast to fixing or locking elements designed as separate components.

In one preferred geometric embodiment of the receiving contour, it is designed as generally rectangular, the wall area having at least two wall sections parallel to one another, and at least one fixing or locking element being situated on each of the two parallel wall sections. When viewed over the circumference of the receiving contour, a uniform contact pressure of the connecting plug on the housing of the electrical device is thus achieved in particular. In addition, it is to be noted that upon an increase of the number of the fixing or locking elements, the forces to be transmitted by each fixing or locking element may be reduced. Furthermore, a greater number of fixing or locking elements also produces a particularly uniform distribution of the contact pressure of the connecting plug on the housing.

To optimize the outer lock and the inner lock, the at least one fixing or locking element may be designed differently in each case inside and outside the wall area.

A fixing or locking element may be formed with a particularly simple design if it has a recess for the formfitting accommodation of a counter element of the connecting plug.

Furthermore, it is advantageous if the at least one fixing or locking element inside and outside the wall area is situated in each case on directly opposing areas of the wall area. The background of this is that in particular in the case of a design as an injection-molded part, a fixing or locking element forms an increased thickness of the wall area having a corresponding reinforcing effect. If a holding or clamping force is introduced via a fixing or locking element from the connecting plug into the wall area, the fixing or locking element which is not stressed will enable stiffening and therefore particularly good force application of the holding or clamping forces into the connection area.

The present invention also relates to a connection arrangement between an electrical device according to the present invention and a connecting plug, which is designed to interact with a fixing or locking element situated inside or outside the wall area of the electrical device.

To achieve a preferably simple installation of the connecting plug on the electrical device, it may be provided that the connecting plug has a clamping bracket. Such a clamping bracket has the advantage that via the force transmission ratio thereof, relatively high clamping or holding forces may be produced using relatively low operating forces, and the clamping lever typically has a defined end position, which may be recognized particularly easily by an operator.

To achieve a preferably high sealing effect between the connection area and the connecting plug, it is provided in one refinement of the connection arrangement that the connecting plug has a closed circumferential wall adapted to the contour of the wall area, which at least in sections interacts with the wall area of the receiving contour inside or outside thereof.

Further advantages, features, and details of the present invention result from the description below of preferred exemplary embodiments and on the basis of the figures.

BRIEF DESCRIPTION OF THE DRAWINGS

FIG. 1 shows a perspective view of a plug body according to the present invention, which is designed as a plastic injection-molded part, on an electrical device.

FIG. 2 shows the plug body according to FIG. 1 in a perspective individual view.

DETAILED DESCRIPTION OF EXAMPLE EMBODIMENTS

Figure 3:
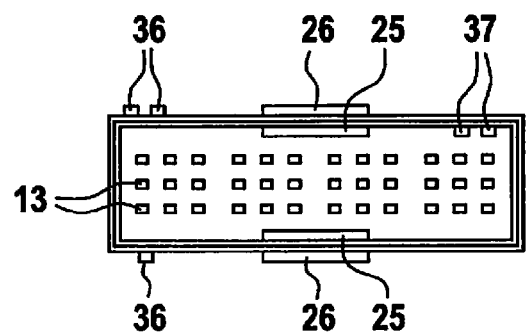
FIG. 3 shows a simplified top view of a plug body, which is modified in relation to FIGS. 1 and 2, to illustrate different locking options.

Identical elements or elements having the same function are provided with the same reference numerals in the figures.

FIGS. 1 and 2 show a connection area 10 of an electrical device 1, in particular a switching unit or control unit in a motor vehicle. Connection area 10 is formed by a plug body 11, which is made of plastic and is produced in the injection molding process, and which is situated on a front side of a housing 12 (only recognizable in FIG. 1) of electrical device 1 and is connected to housing 12. Housing 12 is used in a known way to accommodate an electronic or electrical circuit, in particular on at least one circuit carrier such as a circuit board, or the like, the electronic or electrical circuit being electrically contactable via connecting pins 13 or pin terminals, which are recognizable in FIGS. 1 and 2.

In the exemplary embodiment shown in FIGS. 1 and 2, connection area 10 is equipped with two wall areas 14, 15, each having a closed, generally rectangular contour, which extend perpendicularly from front side 16 of plug body 11 or protrude away therefrom and enclose connecting pins 13. The two wall areas 14, 15 each have two wall sections 17, 18 situated in parallel to one another, wall sections 17 of wall area 14 having a lesser length or extension than wall sections 18 of wall area 15. Wall sections 17, 18 are each connected to wall sections 19, which are situated in parallel to one another and are situated perpendicular to wall sections 17, 18, transition areas 20 between wall sections 17, 19 and 18, 19 each being formed as rounded.

A connection area 10, plug body 11 of which has two circumferential wall areas 14, 15, is used for electrically contacting electrical device 10 with the aid of two separate connecting plugs (not shown in FIGS. 1 and 2). The connecting plugs are in particular part of a vehicle-side wiring harness.

It is provided according to the present invention that in the area of wall areas 14, 15, which each form a receiving contour 22, 23 for the mentioned connecting plug, in each case at least one fixing or locking element 25, 26 is situated inside and outside of receiving contour 22, 23. In the illustrated exemplary embodiment according to FIGS. 1 and 2, two fixing or locking elements 25 are situated inside particular receiving contour 22, 23 on each of wall sections 17, 18, and two fixing or locking elements 26 are also situated in each case outside receiving contour 22, 23. Furthermore, fixing or locking elements 25, 26 are designed differently insofar as (outer) fixing or locking elements 26 extend over the entire height of wall sections 17, 18, while fixing or locking elements 25 have a lesser extension in relation thereto.

Fixing or locking elements 25, 26 are formed in one piece on particular wall section 17, 18 of wall area 14, 15 and are each situated aligned with one another, i.e., on directly opposing areas of particular wall section 17, 18 in each case. Furthermore, each of fixing or locking elements 25, 26 has a recess 27, 28 in the form of a receiving groove, which is used to form a clamped or force-fit connection to the wiring-harness-side counter plug or connecting plug. Fixing or locking elements 25 which are situated inside particular receiving contour 22, 23 are used to form an inner lock, while fixing or locking elements 26, which are situated outside particular receiving contour 22, 23, are used to form an outer lock.

Figure 6:
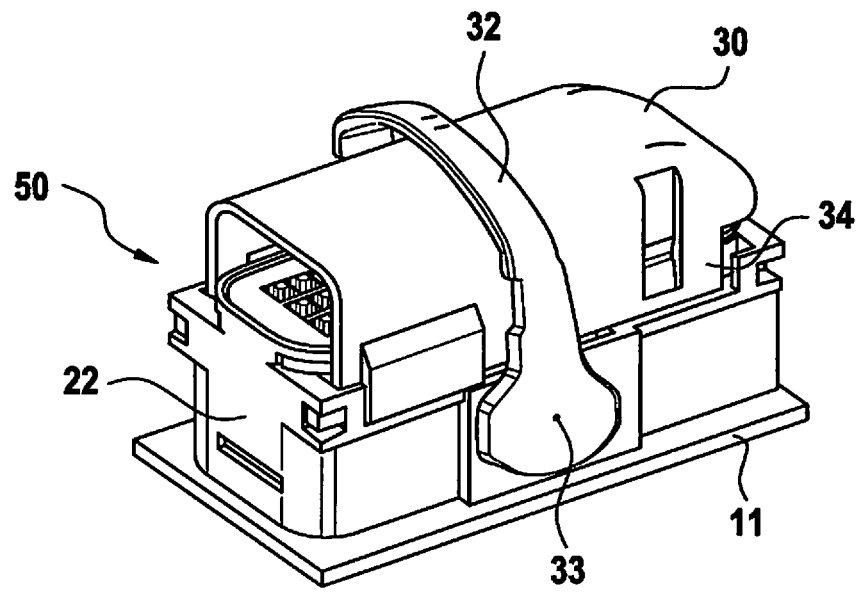
FIG. 6 and FIG. 7 show the connection arrangements according to FIGS. 4 and 5 in a perspective, partially sectional view in each case.
Figure 7:
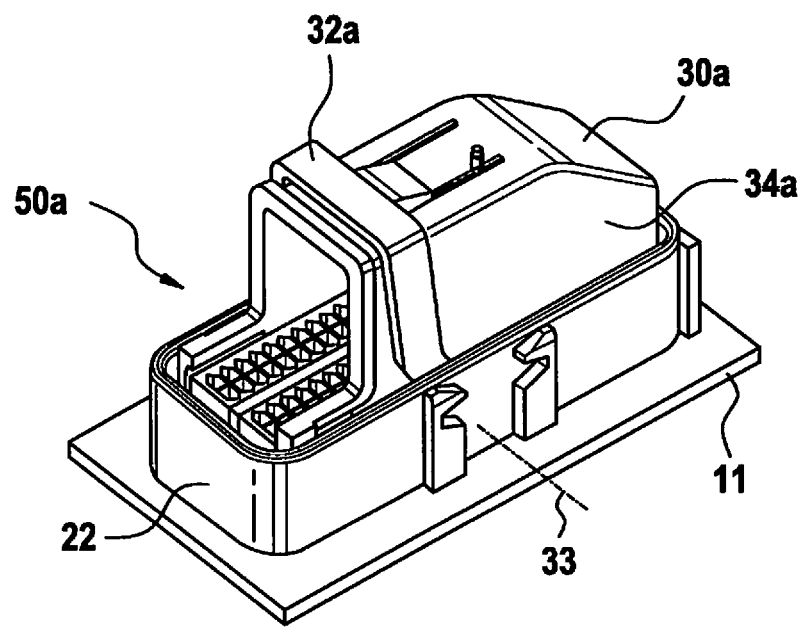

FIGS. 6 and 7 each show a partially sectional view of a vehicle-side counter plug or connecting plug 30, 30*a* to form a connection arrangement 50, 50*a* between plug body 11 of electrical device 1 and corresponding connecting plug 30, 30*a*. Connecting plug 30 shown in FIG. 6 is used to form an outer lock, while counter plug 30, 30*a* shown in FIG. 7 is designed to form an inner lock with plug body 11. In both cases, connecting plug 30, 30*a* has a clamping bracket 32, 32*a* in each case, which is situated pivotably about an axis 33, and in an end position forms a fixed, locked connection between particular connecting plug 30, 30*a* and connection area 10 or plug body 11. In addition, both connecting plugs 30, 30*a* are provided with a closed circumferential wall 34, 34*a*, which is encompassed essentially without a gap by receiving contour 22 of plug body 11 on the outer circumference (FIG. 6) and on the inner circumference (FIG. 7) thereof, at least on a partial area thereof.

To form the outer lock, connecting plug 30 has holding elements (not shown) on its clamping lever 32, which interact with fixing or locking elements 25 situated outside receiving contour 23. Connecting plug 30 therefore has a greater width in the area of clamping lever 32 than receiving contour 22 of plug body 11.

Clamping lever 32*a* shown in FIG. 7, in contrast, is situated inside receiving contour 22 of plug body 11 and also has counter elements (not shown), which interact with fixing or locking elements 26 situated inside receiving contour 22. Counter plug 30*a* therefore does not widen connection arrangement 50*a* beyond the area of receiving contour 22.

Figure 4:
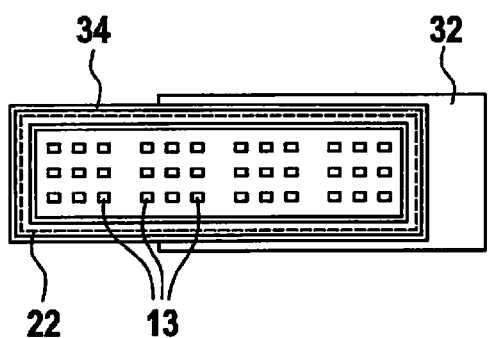
FIG. 4 and FIG. 5 show the plug body according to FIG. 3 in conjunction with a vehicle-side connecting plug to form an outer lock and an inner lock, each in a simplified view.
Figure 5:
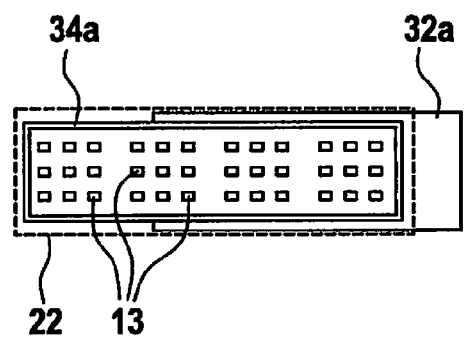

In FIGS. 3 through 5, fixing or locking elements 25, 26 are once again recognizable on plug body 11 in a simplified view. In addition, on the basis of FIG. 3, codings 36, 37, which are designed in the form of projections or the like and are molded in one piece on plug body 11, may be recognized, which interact with corresponding counter codings on connecting plug 30, 30*a* and in particular enable a connection of connecting plug 30, 30*a* to plug body 11 in only one direction or orientation.

It is once again recognizable in FIG. 4 that in the case of an outer lock, clamping lever 32 encompasses receiving contour 22 with its circumferential wall 34 from the outside, while in the case of an inner lock, according to the illustration of FIG. 5, clamping lever 32*a* and circumferential wall 34*a* are situated inside receiving contour 22 and therefore do not enlarge the width of receiving contour 22.

Above-described electrical device 1 and connection arrangement 50 may be altered or modified in manifold ways, without departing from the concept of the present invention. This concept includes the use of the same plug body for use in the case of an inner lock or an outer lock in interaction with a correspondingly designed counter plug 30, 30*a*.

What is claimed is:

1. An electrical device, comprising:
   a housing;
   a single wall that is formed on an exterior surface of the housing, extends away from the exterior surface of the housing to an end of the single wall, and circumferentially surrounds a connection area;
   electrical connecting elements in the connection area within the single wall and extending longitudinally away from the surface of the housing to respective ends configured for alternatively mating with corresponding respective electrical connecting elements of a plurality of connecting plugs that are each alternatively pluggable onto or into the single wall in a direction from the end of the single wall towards the surface of the housing, to thereby provide an electrical connection between the electrical device and the connecting plug;
   wherein at least one first fixing or locking element, which is designed to fix a first one of the connecting plugs to the housing by preventing withdrawal of the first one of the connecting plugs from the housing in a direction from the surface of the housing towards the end of the single wall, is formed on an interior surface of the single wall within the connection area, and at least one second fixing or locking element, which is designed to fix a second one of the connecting plugs to the housing by preventing withdrawal of the second one of the connecting plugs from the housing in the direction from the surface of the housing towards the end of the single wall, is formed on an exterior surface of the single wall.

2. The electrical device as recited in claim 1, wherein the electrical device is a switching unit or control unit for a motor vehicle.

3. The electrical device as recited in claim 1, wherein the at least one first fixing or locking element and the at least one second fixing and locking element are fastened directly on the wall.

4. The electrical device as recited in claim 1, wherein the at least one first fixing or locking element and the at least one second fixing and locking element are molded in one piece on the wall.

5. An electrical device comprising:
   a housing;
   a wall that is formed on an exterior surface of the housing, extends away from the exterior surface of the housing to an end of the wall, and circumferentially surrounds a connection area;
   electrical connecting elements in the connection area within the wall and extending longitudinally away from the surface of the housing to respective ends configured for alternatively mating with corresponding respective electrical connecting elements of a plurality of connecting plugs that are each alternatively pluggable onto or into the wall in a direction from the end of the wall towards the surface of the housing, to thereby provide an electrical connection between the electrical device and the connecting plug;
   wherein:
   at least one first fixing or locking element, which is designed to fix a first one of the connecting plugs to the housing, is formed on an interior of the wall within the connection area;
   at least one second fixing or locking element, which is designed to fix a second one of the connecting plugs to the housing, is formed on an exterior of the wall;
   the wall defines a generally rectangular shaped receiving contour and includes at least two wall sections parallel to each other;
   the at least one first fixing or locking element includes a section on each of the two parallel wall sections; and
   the at least one second fixing or locking element includes a section on each of the two parallel wall sections.

6. The electrical device as recited in claim 1, wherein the at least one first fixing or locking element is designed differently than the at least one second fixing or locking element.

7. The electrical device as recited in claim 1, wherein the at least one first fixing or locking element and the at least one second fixing or locking element each has a respective recess for a formfitting accommodation of a respective counter element of a respective one of the connecting plugs.

8. An electrical device comprising:
a housing;
a wall that is formed on an exterior surface of the housing, extends away from the exterior surface of the housing to an end of the wall, and circumferentially surrounds a connection area;
electrical connecting elements in the connection area within the wall and extending longitudinally away from the surface of the housing to respective ends configured for alternatively mating with corresponding respective electrical connecting elements of a plurality of connecting plugs that are each alternatively pluggable onto or into the wall in a direction from the end of the wall towards the surface of the housing, to thereby provide an electrical connection between the electrical device and the connecting plug;
wherein:
at least one first fixing or locking element, which is designed to fix a first one of the connecting plugs to the housing, is formed on an interior of the wall within the connection area;
at least one second fixing or locking element, which is designed to fix a second one of the connecting plugs to the housing, is formed on an exterior of the wall;
the at least one first fixing or locking element includes a first pair of elements situated on respective areas of the wall that are directly opposite each other and face each other; and
the at least one second fixing or locking element includes a second pair of elements situated on respective areas of the wall that are directly opposite each other and face away from each other.

9. A connection arrangement, comprising:
a first connecting plug; and
an electrical device that includes:
a housing;
a single wall that is formed on an exterior surface of the housing, extends away from the exterior surface of the housing to an end of the single wall, and circumferentially surrounds a connection area;
electrical connecting elements in the connection area within the single wall and extending longitudinally away from the surface of the housing to respective ends configured for alternatively mating with corresponding respective electrical connecting elements of (a) the first connecting plug and (b) a second connecting plug, each of the first and second connecting plugs being alternatively pluggable onto or into the single wall in a direction from the end of the single wall towards the surface of the housing, to thereby provide an electrical connection between the electrical device and the respective connecting plug;
wherein:
at least one first fixing or locking element, which is designed to fix one of the first and the second connecting plugs to the housing by preventing withdrawal of the one of the first and second connecting plugs from the housing in a direction from the surface of the housing towards the end of the single wall, is formed on an interior surface of the single wall within the connection area, and at least one second fixing or locking element, which is designed to fix the other of the first and second connecting plugs to the housing by preventing withdrawal of the other of the first and second connecting plugs from the housing in the direction from the surface of the housing towards the end of the single wall, is formed on an exterior surface of the single wall; and
the first connecting plug includes at least one component that is designed to form fittingly interact with the at least one first fixing or locking element or with the at least one second fixing or locking element.

10. The connection arrangement as recited in claim 9, wherein the electrical device is a switching unit or a control unit for a motor vehicle.

11. The connection arrangement as recited in claim 9, wherein the at least one component of the first connecting plug includes a clamping bracket for a force-fit connection to the electrical device.

12. The connection arrangement as recited in claim 9, wherein the first connecting plug has a closed circumferential wall which is adapted to a contour of the wall and, at least in sections, interacts with the contour.

* * * * *